(12) United States Patent
Lee et al.

(10) Patent No.: US 10,672,848 B2
(45) Date of Patent: Jun. 2, 2020

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Hyeon Bum Lee, Hwaseong-si (KR); Hyoeng Ki Kim, Suwon-si (KR); Kyong Heon Lee, Cheonan-si (KR); Dong Ki Lee, Seongnam-si (KR); Eon Joo Lee, Goyang-si (KR); Jin Whan Jung, Chungcheongnam-do (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 11 days.

(21) Appl. No.: 15/629,894

(22) Filed: Jun. 22, 2017

(65) Prior Publication Data

US 2018/0053815 A1 Feb. 22, 2018

(30) Foreign Application Priority Data

Aug. 18, 2016 (KR) .......................... 10-2016-0104929

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ........ *H01L 27/3258* (2013.01); *H01L 27/322* (2013.01); *H01L 27/3262* (2013.01); *H01L 51/0021* (2013.01); *H01L 51/5203* (2013.01); *H01L 51/524* (2013.01); *H01L 51/5253* (2013.01); *H01L 51/5284* (2013.01); *H01L 51/56* (2013.01); *H01L 51/5209* (2013.01)

(58) Field of Classification Search
CPC ............ H01L 27/3244; H01L 27/3246; H01L 27/3211; H01L 27/3216; H01L 27/3213; H01L 27/322
USPC .......... 313/500, 506; 257/E21.158, E33.061, 257/E51.022, 40, 89; 438/29, 99
See application file for complete search history.

(56) References Cited

U.S. PATENT DOCUMENTS

| | | | |
|---|---|---|---|
| 8,987,712 B2 | 3/2015 | Saito et al. | |
| 2005/0100661 A1* | 5/2005 | Lee | H01L 27/3246 427/66 |
| 2006/0284204 A1* | 12/2006 | Yamazaki | H01L 27/322 257/98 |
| 2007/0108899 A1* | 5/2007 | Jung | H01L 27/3276 313/506 |

(Continued)

FOREIGN PATENT DOCUMENTS

| | | |
|---|---|---|
| KR | 10-2012-0045470 A | 5/2012 |
| KR | 10-2014-0114312 A | 9/2014 |
| KR | 10-2015-0078392 A | 7/2015 |

*Primary Examiner* — Jonathan Han
(74) *Attorney, Agent, or Firm* — Kile Park Reed & Houtteman PLLC

(57) ABSTRACT

A display device including a substrate, a source electrode and a drain electrode on the substrate, the source electrode and the drain electrode being spaced apart from each other, a first planarization layer on the source electrode and the drain electrode, a second planarization layer on the first planarization layer, and a first electrode on the second planarization layer. A step difference between a top of the first planarization layer and a top of the drain electrode is 100 Å or less.

19 Claims, 14 Drawing Sheets

(56) References Cited

U.S. PATENT DOCUMENTS

| | | | |
|---|---|---|---|
| 2008/0297032 A1* | 12/2008 | Kim | H01L 27/3246 313/504 |
| 2009/0309108 A1 | 12/2009 | Chang et al. | |
| 2010/0238096 A1* | 9/2010 | Jeon | H01L 27/3218 345/83 |
| 2011/0279023 A1* | 11/2011 | Nishioka | H01L 27/3253 313/504 |
| 2014/0166997 A1* | 6/2014 | Kim | H01L 27/1248 257/40 |

\* cited by examiner

DISPLAY DEVICE AND METHOD FOR MANUFACTURING THE SAME

CROSS-REFERENCE TO RELATED APPLICATION

Korean Patent Application No. 10-2016-010429, filed on Aug. 18, 2016, in the Korean Intellectual Property Office, and entitled: "Display Device and Method for Manufacturing the Same," is incorporated by reference herein in its entirety.

BACKGROUND

1. Field

Embodiments relate to a display device and a method for manufacturing the same.

2. Description of the Related Art

The importance of display devices is increasing along with the development of multimedia. Accordingly, various kinds of display devices such as liquid crystal displays (LCDs), organic light emitting displays (OLEDs) and the like are being used.

Among the display devices, an organic light emitting display device (OLED) has received much attention as a next generation display device due to its wide viewing angles, excellent contrast ratio, and fast response speeds. An organic light emitting layer includes an emission layer made of an organic material interposed between an anode electrode and a cathode electrode. When anode voltage and cathode voltage are applied respectively to the anode electrode and cathode electrode, holes injected from the anode electrode move to the emission layer via a hole injection layer and a hole transport layer, and electrons move from the cathode electrode to the emission layer via the electron injection layer and electron transport layer, and electrons and holes are recombined in the emission layer to form an exciton. The exciton changes from an excited state to a ground state to emit light, thereby displaying images.

SUMMARY

Embodiments are directed to a display device including a substrate, a source electrode and a drain electrode on the substrate, the source electrode and the drain electrode being spaced apart from each other, a first planarization layer on the source electrode and the drain electrode, a second planarization layer on the first planarization layer, and a first electrode on the second planarization layer. A step difference between a top of the first planarization layer and a top of the drain electrode is 100 Å or less.

A step difference between highest and lowest portions in an upper surface of the first electrode may be 70 nm or less.

The first planarization layer may include one or more selected from a polyimide, a polyacryl, and a polysiloxane.

The first planarization layer may have a thickness of 0.8 µm.

The first planarization layer may include black pigment.

The black pigment may include black carbon.

The second planarization layer may include black pigment.

Embodiments are also directed to a display device including a substrate, a source electrode and a drain electrode on the substrate, the source electrode and the drain electrode being spaced apart from each other, a first planarization layer on the source electrode and the drain electrode, a second planarization layer on the first planarization layer, a first electrode on the second planarization layer, and a black matrix on the first electrode.

The display device may further include an encapsulation layer on the first electrode, wherein the black matrix is on the encapsulation layer.

The display device may further include a color filter on the encapsulation layer.

The display device may further include a second electrode facing the first electrode, and a cover layer on the second electrode.

The cover layer may include manganese.

A step difference between a highest portion and a lowest portion of an upper surface of the first electrode may be 70 nm or less.

A step difference between the a top of the first planarization layer and a top of the drain electrode may be 100 Å or less.

The first planarization layer may include a black pigment.

The black pigment may include black carbon.

The second planarization layer may include a black pigment.

Embodiments are also directed to a method for manufacturing a display device including preparing a substrate on which a source electrode and a drain electrode are disposed and spaced apart from each other, forming a first planarization layer on the source electrode and the drain electrode such that a step difference between a top of the first planarization layer and a top of the drain electrode is 100 Å or less, forming a second planarization layer on the first planarization layer, and forming a first electrode on the second planarization layer.

A step difference in a highest portion and a lowest portion of an upper surface of the first electrode may be 70 nm or less.

The first planarization layer may include a black pigment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
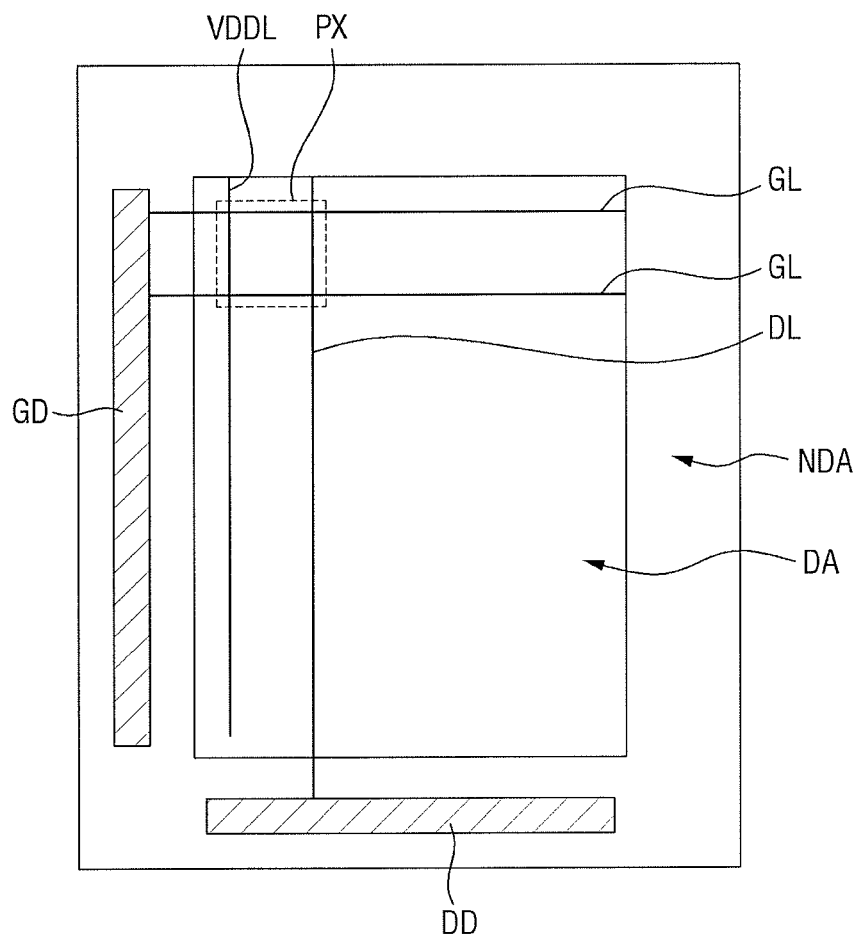
FIG. 1 illustrates a layout diagram depicting a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
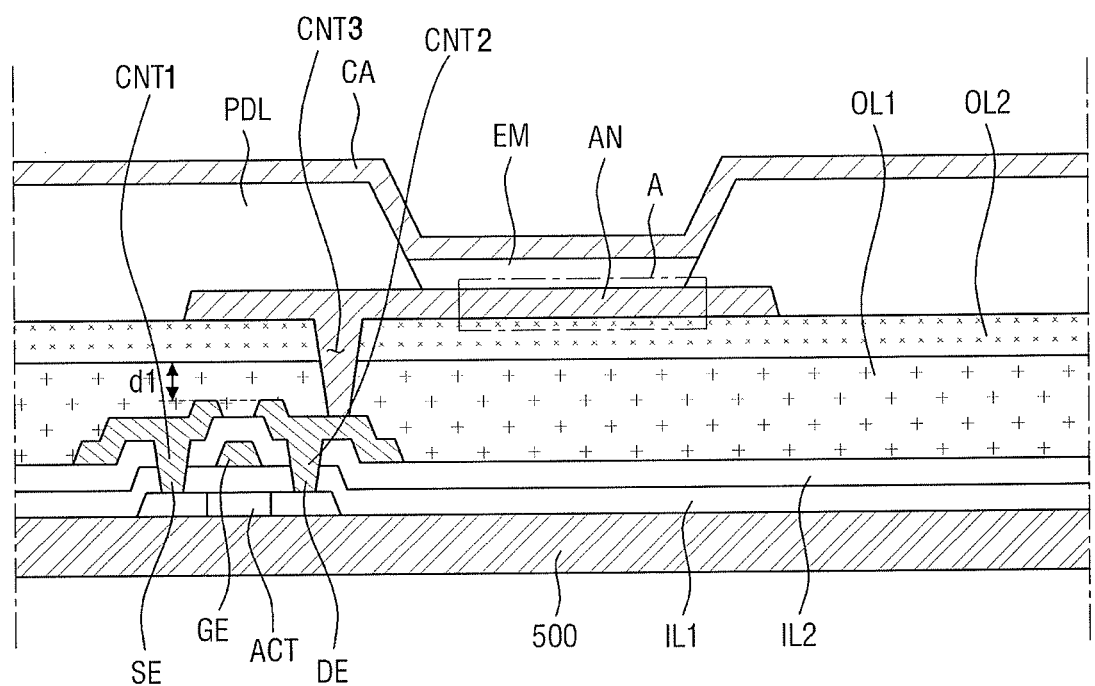
FIG. 2 illustrates a cross-sectional view of a display device according to an embodiment.
Figure 3:
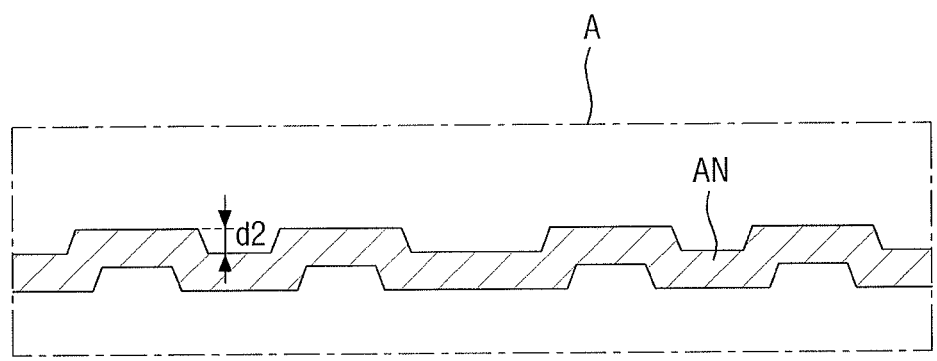
FIG. 3 illustrates an enlarged view of part "A" of FIG. 2.

FIG. 1 illustrates a layout diagram depicting a display device according to an embodiment. FIG. 2 illustrates a cross-sectional view of a display device according to an embodiment. FIG. 3 illustrates an enlarged view of part "A" of FIG. 2.

Referring to FIG. 1 to FIG. 3, the display device according to an embodiment may include: a substrate 500, a source electrode SE and a drain electrode DE disposed on the substrate 500 and spaced apart from each other, a first planarization layer OL1 disposed on the source electrode SE and the drain electrode DE, a second planarization layer OL2 disposed on the first planarization layer OL1, and a first electrode AN disposed on the second planarization layer OL2.

Referring to FIG. 1, the display device according to an embodiment may include a display area DA, and a non-display area NDA disposed outside the display area DA.

The display area DA may display various images. The non-display area NDA may have various signal lines disposed therein to enable the display area DA to display an image.

For example, a gate driving unit GD and/or a data driving unit DD may be disposed in the non-display area NDA.

The gate driving unit GD may provide a signal to a gate line GL disposed in the display area. The data driving unit DD may provide a data signal to a data line DL disposed in the display area DA.

Although the gate driving unit GD and the data driving unit DD are illustrated as being independently formed in FIG. 1, in some implementations, the two units may be integrally formed in another embodiment.

In some implementations, either the gate driving unit or the data driving unit may be omitted.

The gate line GL extending in a first direction may be disposed in the display area DA. The gate line GL may extend from the gate driving unit GD disposed in the non-display area NDA. The first direction may be, for example, a horizontal direction, as shown in FIG. 1.

The data line DL intersecting the gate line GL may be disposed in the display area DA. The data line DL may extend in a second direction in the display area DA. The data line DL may extend from the data driving unit DD disposed in the non-display area NDA. The second direction may be, for example, a vertical direction, as shown in FIG. 2.

A common power line VDDL may be disposed in the display area. A common voltage may be provided to the common power line VDDL.

The common power line VDDL and the data line DL may be disposed in parallel with each other. For example, the common power line VDDL and the data line DL may extend in parallel with each other with a predetermined gap therebetween.

In an embodiment, the common power line VDDL and the data line DL may be made of the same material. In an embodiment, the common power line VDDL and the data line DL may be formed on the same layer.

One common power line VDDL, the data line DL, and two gate lines GL adjacent to each other may cooperate to define one pixel PX. A plurality of thus-defined pixels PX may be disposed in the display area DA.

At least one transistor may be disposed in a pixel. In an embodiment, at least two transistors, for example, a driving transistor and a switch transistor may be disposed in each pixel.

FIG. 2 illustrates the driving transistor disposed in the pixel PX. Components of the display device according to an embodiment will now be described with reference to FIG. 2.

The substrate 500 may include an insulation substrate. In an embodiment, the insulation substrate may be made of transparent glass having $SiO_2$ as a main component. In an embodiment, the substrate 500 may be made of a plastic material. In an embodiment, the substrate 500 may be a flexible substrate that can be bent, folded, or rolled. In this case, the substrate 500 may include polyimide.

A semiconductor pattern layer ACT may be disposed on the substrate 500. The semiconductor pattern layer ACT may be made of one or a mixture of two or more materials selected from amorphous silicon, polycrystalline silicon, or monocrystalline silicon. In an embodiment, the semiconductor pattern layer ACT may include an oxide semiconductor.

In an embodiment, when the semiconductor pattern layer ACT is an oxide semiconductor, the semiconductor pattern layer ACT may include one or more selected from the group consisting of ZnO, ZnGaO, ZnInO, ZnSnO, GaInZnO, CdO, InO, GaO, SnO, AgO, CuO, GeO, GdO, HfO, TiZnO, InGaZnO, and InTiZnO.

A first insulation layer IL1 may be disposed on the semiconductor pattern layer ACT. In an embodiment, the first insulation layer IL1 may be a gate insulation layer.

The first insulation layer IL1 covering the semiconductor pattern layer ACT may be formed on the entire surface of the substrate 500.

The first insulation layer IL1 may be made of one or a mixture of two or more materials selected from the group of an inorganic insulation material such as silicon oxide (SiOx) and silicon nitride (SiNx) and an organic insulation material such as benzocyclobutene (BCB), an acrylic material, and a polyimide.

A gate electrode GE may be disposed on the first insulation layer IL1. The gate electrode GE may extend from the aforementioned gate line GL and may receive a gate signal from the gate line GL.

The gate electrode GE may include, for example, one or more among an aluminum (Al)-based metal including an aluminum alloy, a silver (Ag)-based metal including a silver alloy, a copper (Cu)-based metal including a copper alloy, and a molybdenum (Mo)-based metal including a molybdenum alloy, chromium (Cr), titanium (Ti), and tantalum (Ta).

FIG. 2 illustrates the gate electrode GE as being a single layer. In some implementations, the gate electrode GE may be a laminate including two or more layers.

A second insulation layer IL2 may be disposed on the gate electrode GE. The second insulation layer IL1 may be made of one material or a mixture of two or more materials selected from a group of an inorganic insulation material such as silicon oxide (SiOx) and silicon nitride (SiNx) and an organic insulation material such as benzocyclobutene (BCB), an acrylic material, and a polyimide.

A first contact CNT1 and a second contact CNT2 may penetrate through the first insulation layer IL1 and the second insulation layer IL2 so as to expose the semiconductor pattern layer ACT. The first contact CNT1 and the second contact CNT2 may be spaced apart from each other.

The source electrode SE and the drain electrode DE may be disposed on the second insulation layer IL2. The source electrode SE and the drain electrode DE may be spaced apart from each other. The source electrode SE may be electrically connected to the aforementioned data line DL so as to receive a data signal.

In an embodiment, the source electrode SE and the drain electrode DE may be made of the same material. The source electrode SE and the drain electrode DE may include one or more selected from metal, an alloy, metal nitride, conductive metal oxide, and a transparent conductive material. For example, the source electrode SE and the drain electrode DE may have a single-layer or multi-layer structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), or the like. Furthermore, an alloy formed of the above-mentioned metal and one or more elements selected from a group consisting of titanium (Ti), zirconium (Zr), tungsten (W), tantalum (Ta), niobium (Nb), platinum (Pt), hafnium (Hf), oxygen (O), and nitrogen (N) may be used as a material for the source electrode SE and the drain electrode DE.

In an embodiment, the source electrode SE and the drain electrode DE may be disposed on the same layer such that the source electrode SE and the drain electrode DE may be formed simultaneously through the same process. In some implementations, the source electrode SE and the drain electrode DE may be disposed on different layers.

The source electrode SE may be electrically connected to the semiconductor pattern layer ACT through the first contact CNT1. The drain electrode DE may be electrically connected to the semiconductor pattern layer ACT through the second contact CNT2.

The first planarization layer OL1 may be disposed on the source electrode SE and the drain electrode DE.

In an embodiment, the first planarization layer OL1 may be an organic layer. The first planarization layer may be made of, for example, one or more selected from polyimide, polyacryl, and polysiloxane.

In an embodiment, the first planarization layer OL1 may have a thickness of, for example, approximately 0.8 μm.

In an embodiment, the first planarization layer OL1 and the source electrode SE or the drain electrode DE may have a step difference d1 therebetween of 100 Å or less. The term "step difference" as used herein may refer to a distance between a top of one component and a top of another component. In some implementations, the term "step difference" may refer to a distance between an average level of one component and an average level of another component. In this case, the "level" may be understood as a height from a reference line. Furthermore, a step difference may be defined in one component. In this case, the step difference may mean a height difference in a specific portion of one component.

When the step difference d1 between the first planarization layer OL1 and the source electrode SE or the drain electrode DE is maintained at 100 Å or less, a step difference in an upper surface of a second planarization layer OL2, which will be described below, may be reduced, and thus a step difference of the first electrode AN may be reduced. A reduced step difference of the first electrode AN may help present a color separation phenomenon caused by external light in each pixel from being seen. When the color separation phenomenon occurring in each pixel is prevented, the necessity of using a polarizer in a display device may be eliminated, thus reducing production costs. The elimination of the polarizer may reduce a thickness of a display device.

A first sub contact C1 may be formed in the first planarization layer OL1 such that the first sub contact C1 penetrates through the first planarization layer OL1. The first sub contact C1 may expose at least a part of an upper surface of the drain electrode DE.

The second planarization layer OL2 may be disposed on the first planarization layer OL1. The second planarization layer OL2 may be made of, for example, one or more selected from a polyimide, a polyacryl, and a polysiloxane.

A second sub contact C2 may be formed in the second planarization layer OL2 such that the second sub contact C2 penetrates through the second planarization layer OL2. The second sub contact C2 overlap with the first sub contact C1. The second sub contact C2 and the first sub contact C1 may expose at least a part of the upper surface of the drain electrode DE. For convenience of explanation, a combination of the first sub contact C1 and the second sub contact C2 will hereinafter be referred to as a third contact hole CNT3. For example, the third contact hole CNT3 may penetrate through the first planarization layer OL1 and the second planarization layer OL2 so as to expose the drain electrode DE.

In an embodiment, the second planarization layer OL2 may have a thickness of approximately 0.8 μm. In an embodiment, the thickness of the first planarization layer OL1 and the thickness of the second planarization layer OL2 may be substantially the same. In an embodiment, the thickness of the first planarization layer OL1 and the thickness of the second planarization layer OL2 may be different from each other.

The first electrode AN may be disposed on the second planarization layer OL2. In an embodiment, the first electrode AN may be an anode electrode. The first electrode AN may be electrically connected to the drain electrode DE through the third contact CNT3.

The first electrode AN may be made of one or more selected from Ag, Mg, Al, Pt, Pd, Au, Ni, Nd, Ir, Cr, ITO, IZO, and ZnO. Although FIG. 2 illustrates the first electrode AN as being a single layer, in some implementations, the first electrode AN may include a plurality of layers made of different materials.

A pixel defining layer PDL may be disposed on the first electrode AN. The pixel defining layer PDL may be formed on the entire surface of the display area DA, and may expose at least a part of the first electrode AN.

An organic emission layer EM may be formed on the first electrode AN exposed by the pixel defining layer PDL. The organic emission layer EM may be made of a low-molecular or high-molecular organic material.

In an embodiment, the organic emission layer EM may include two or more functional layers.

In an embodiment, the organic emission layer EM may include an emission layer and one or more selected from a hole injection layer, a hole transport layer, an electron transport layer, and an electron injection layer.

A second electrode CA may be formed on the organic emission layer EM. The second electrode CA may be made of a conductive material having a low work function. The second electrode CA as a front electrode may be formed on the entire surface of the substrate 500.

In an embodiment, the second electrode CA may be made of one or more selected from Ag, Mg, Al, Pt, Pd, Au, Ni, Nd, Ir, Cr, ITO, IZO, and ZnO. Although FIG. 2 illustrates the second electrode CA as being a single layer, in some implementations, the second electrode CA may include a plurality of layers made of different materials.

The first electrode AN of the display device will now be described in more detail with reference to FIG. 3.

FIG. 3 illustrates an enlarged view of part "A" of FIG. 2.

Referring to FIG. 3, a step difference d2 may be formed in an upper surface of the first electrode AN. The term "step difference" as used herein may refer to a distance between a highest portion and a lowest portion of the upper surface of the first electrode AN. In an embodiment, the step difference formed in the upper surface of the first electrode AN may be 70 nm or less. As described above, a step difference in the first electrode AN may cause a color separation phenomenon. When the step difference in the upper surface of the first electrode AN is 70 nm or less, the color separation phenomenon may be reduced or prevented.

A display device according to another embodiment will now be described. In the embodiment described hereinafter, identical reference numerals are used to designate identical elements which have been described thus far, and duplicated descriptions thereof will not be repeated or will be abbreviated.

Figure 4:
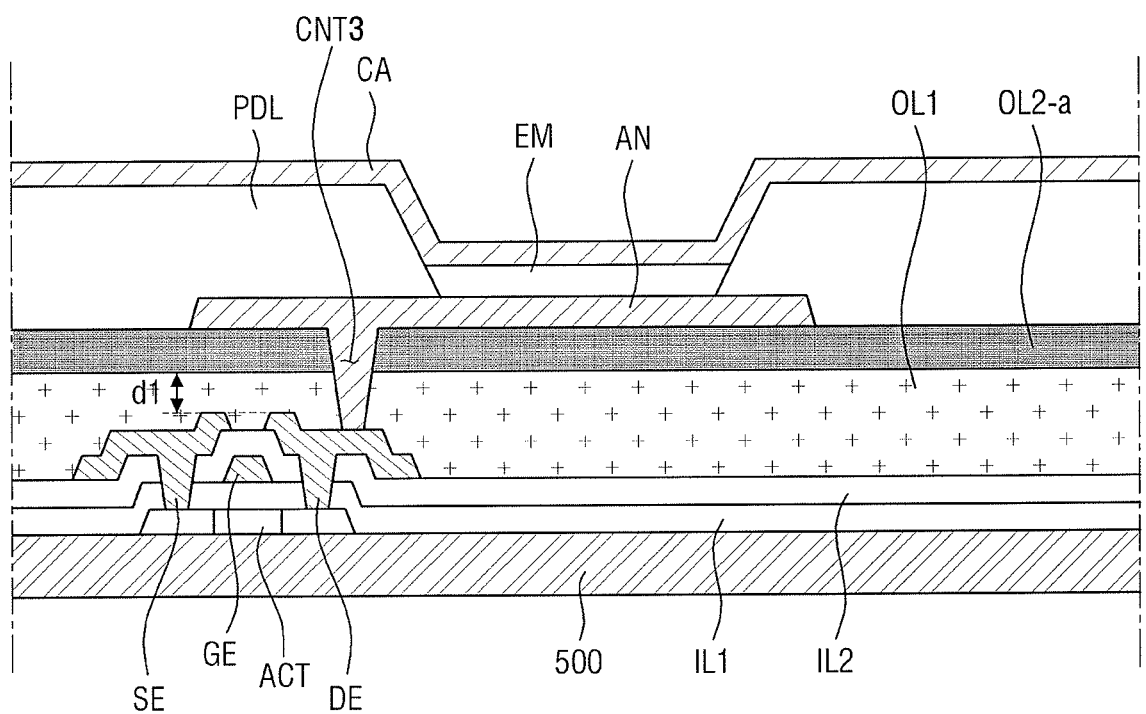
FIG. 4 illustrates a cross-sectional view of a display device according to an embodiment.

FIG. 4 illustrates a cross-sectional view of a display device according to an embodiment.

Referring to FIG. 4, the display device according an embodiment may differ from the display device according to the embodiment described with reference to FIG. 2 in that a second planarization layer OL2_a may include a black pigment.

In an embodiment, the second planarization layer OL2_a may include a black pigment. The black pigment may include, for example, carbon black.

When the second planarization layer OL2_a includes a black pigment, external light emitted to the display device may be at least partially absorbed, thereby minimizing an influence of the external light on a display quality.

Figure 5:
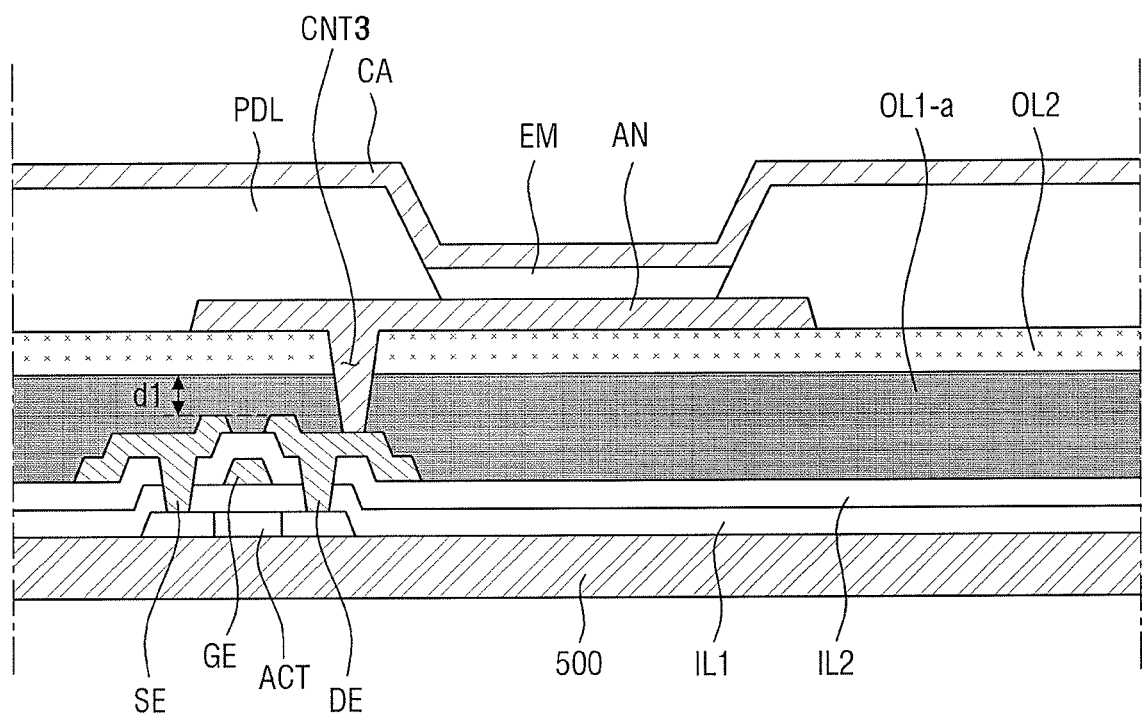
FIG. 5 illustrates a cross-sectional view of a display device according to an embodiment.

FIG. 5 illustrates a cross-sectional view of a display device according to an embodiment.

Referring to FIG. 5, the display device according an embodiment may differ from the display device according to the embodiment described with reference to FIG. 2 in that a first planarization layer OL1_a includes a black pigment.

In an embodiment, the first planarization layer OL1_a may include a black pigment. The black pigment may include, for example, carbon black.

When the first planarization layer OL1_a includes black pigment, external light emitted to the display device may be at least partially absorbed, thereby minimizing an influence of the external light on a display quality.

Although FIG. 4 and FIG. 5 illustrate that either of the two planarization layers includes black pigment, in some implementations, both the first planarization layer OL1_a and the second planarization layer OL2_a may include a black pigment.

Figure 6:
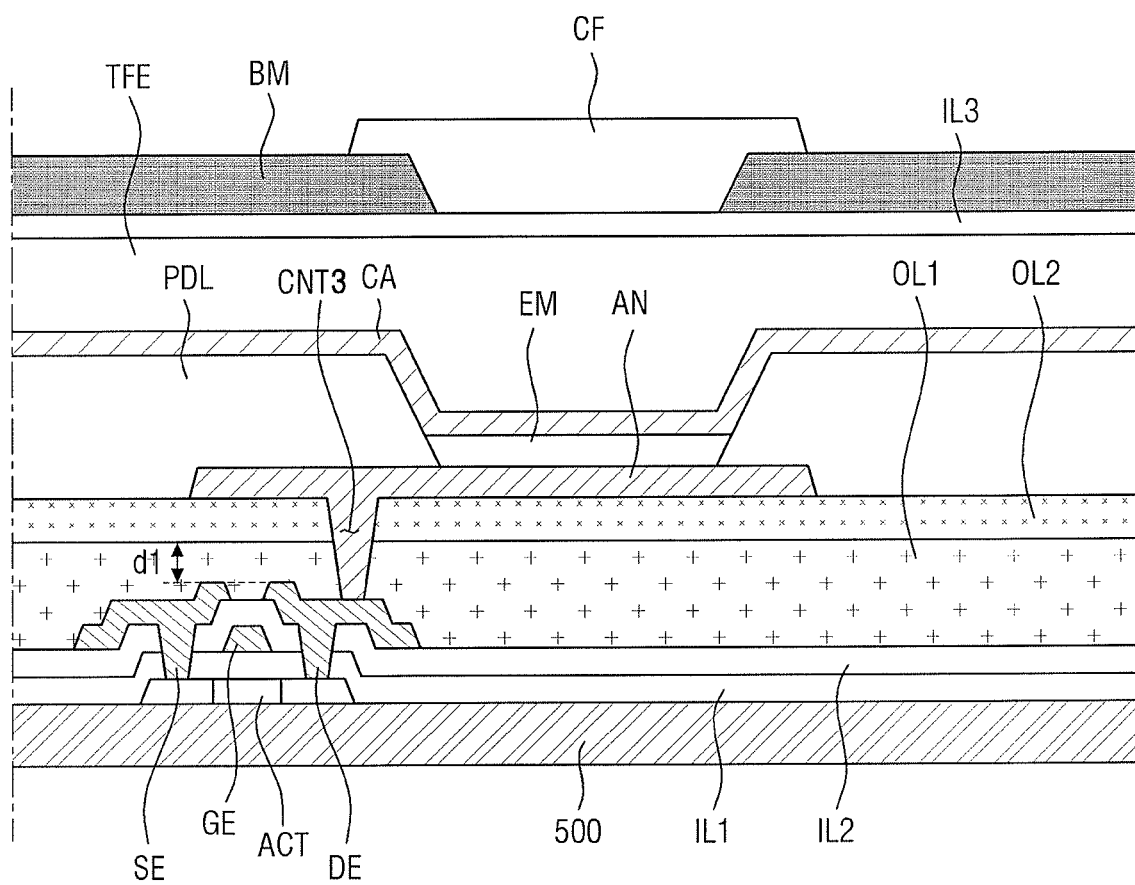
FIG. 6 illustrates a cross-sectional view of a display device according to an embodiment.

FIG. 6 illustrates a cross-sectional view of a display device according to an embodiment.

Referring to FIG. 6, the display device according to an embodiment may further include an encapsulation layer TFE, a third insulation layer IL3, a black matrix BM, and a color filter CF.

The encapsulation layer TFE may be disposed on the second electrode CA. The encapsulation layer TFE may be disposed on the second electrode CA so as to protect the display device from foreign substances or external air.

The encapsulation layer TFE may be made of one or more selected from an acrylic resin, an epoxy-based resin, a polyimide, a polyethylene, a metal oxide, a metal nitride, and a metal carbide, as examples.

Although FIG. 6 illustrates the encapsulation layer TFE being formed of a single layer, in some implementations, the encapsulation layer TFE may be a laminate formed by laminating a plurality of layers.

In an embodiment, the encapsulation layer TFE may have a structure in which organic layers and inorganic layers are alternately laminated.

The third insulation layer IL3 may be formed on the encapsulation layer TFE. The third insulation layer IL3 may be made of an inorganic material or an organic material. In some implementations, the third insulation layer IL3 may be omitted.

The black matrix BM and the color filter CF may be formed on the third insulation layer IL3.

The color filter CF may be disposed to overlap the organic emission layer EM. The color filter CF may be one or more selected from a red filter, a green filter, and a blue filter. The color of the color filter CF may correspond to the color of the organic emission layer EM. For example, when the organic emission layer EM emits a red color, the color filter CF disposed on the organic emission layer EM may be a red color filter. When the color filter CF is disposed on the organic emission layer EM as described above, image sharpness may be enhanced. For example, the display device according to an embodiment may be a top emission organic light emitting display device in which light emitted from the organic emission layer EM is transmitted to a user through the color filter CF.

The color filter CF may absorb at least a part of external light, or may absorb at least a part of external light reflected from an inside, thereby preventing a display quality from being influenced by the external light.

The black matrix BM may be disposed on the third insulation layer IL3. The black matrix BM may be disposed among the plurality of color filters. The black matrix BM may absorb at least a part of external light, or may absorb at least a part of external light reflected from an inside, thereby preventing a display quality from being influenced by the external light.

As described above, when the black matrix BM and/or the color filter CF is disposed on the encapsulation layer TFE, a display quality can be prevented from being influenced by the external light, and thus a polarizer may be be omitted. When the polarizer is omitted, production costs and a thickness of the display device may be reduced.

Figure 7:
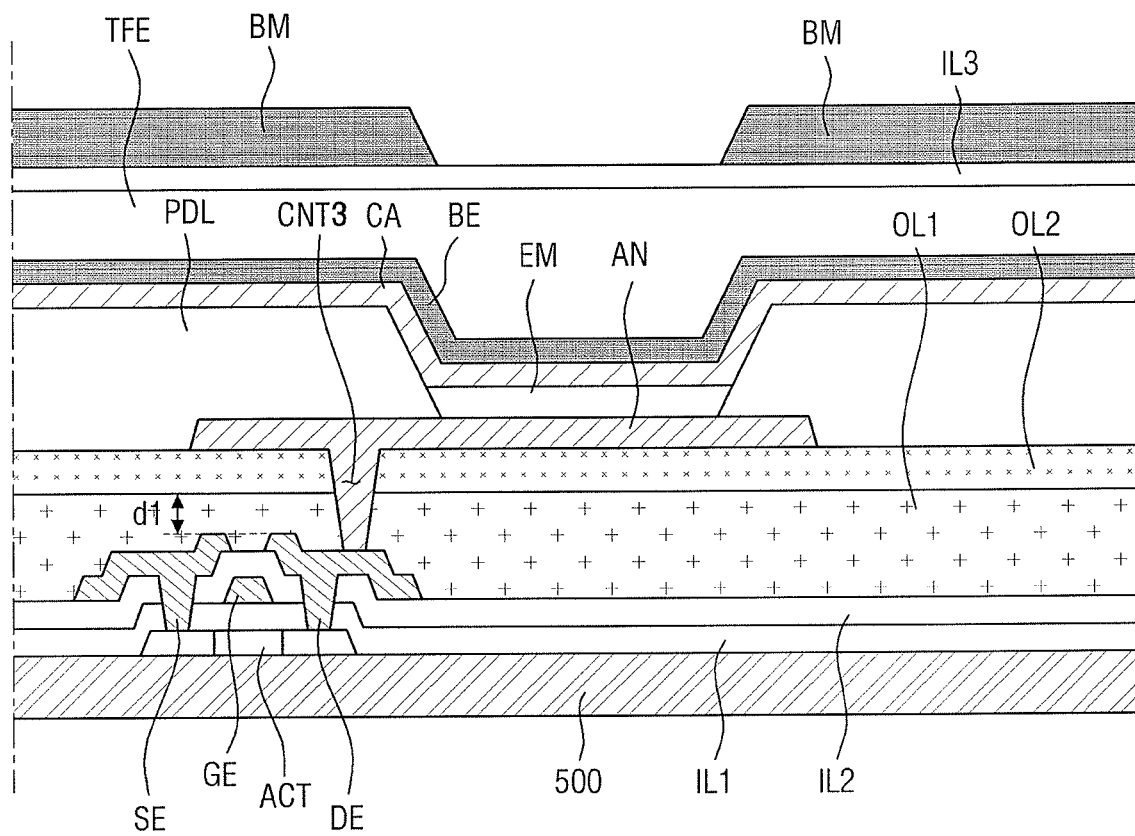
FIG. 7 illustrates a cross-sectional view of a display device according to an embodiment.

FIG. 7 is a cross-sectional view of a display device according to an embodiment. Referring to FIG. 7, the display device according to an embodiment may differ from the display device according to the embodiment described with reference to FIG. 2 in that the former further includes a cover layer BE disposed on the second electrode CA.

In an embodiment, the cover layer BE may be disposed on the second electrode CA. In an embodiment, the cover layer BE may have a black color, or may include black pigment. The cover layer BE may be a metal layer. For example, the cover layer BE may be made of metal having a black color. For example, the cover layer BE may be made of manganese (Mn).

The cover layer BE may absorb at least a part of external light, or may absorb at least a part of external light reflected from an inside.

The encapsulation layer TFE, the third insulation layer IL3, and the black matrix BM may be formed on the cover layer BE. The encapsulation layer TFE, the third insulation layer IL3, and the black matrix BM may be substantially the same as those described above with reference to FIG. 6.

The color filter CF may be omitted in the embodiment described with reference to FIG. 7. In some implementations, the color filter CF may be disposed to correspond to the organic emission layer EM in the embodiment described with reference to FIG. 7.

In the embodiment described with reference to FIG. 7, a display quality can be prevented from being influenced by the external light, and thus a polarizer may be omitted from the display device.

FIG. 8 to FIG. 14 illustrate cross-sectional views illustrating a method for manufacturing a display device according to an embodiment.

Referring to FIG. 8 to FIG. 14, the method for manufacturing a display device according to an embodiment may include: preparing the substrate 500 on which the source electrode SE and the drain electrode DE are disposed and spaced apart from each other, forming the first planarization layer OL1 on the source electrode SE and the drain electrode DE such that a step difference between the first planarization layer OL1 and the drain electrode DE is 100 Å or less; and forming the second planarization layer OL2 on the first planarization layer OL1.

Figure 8:
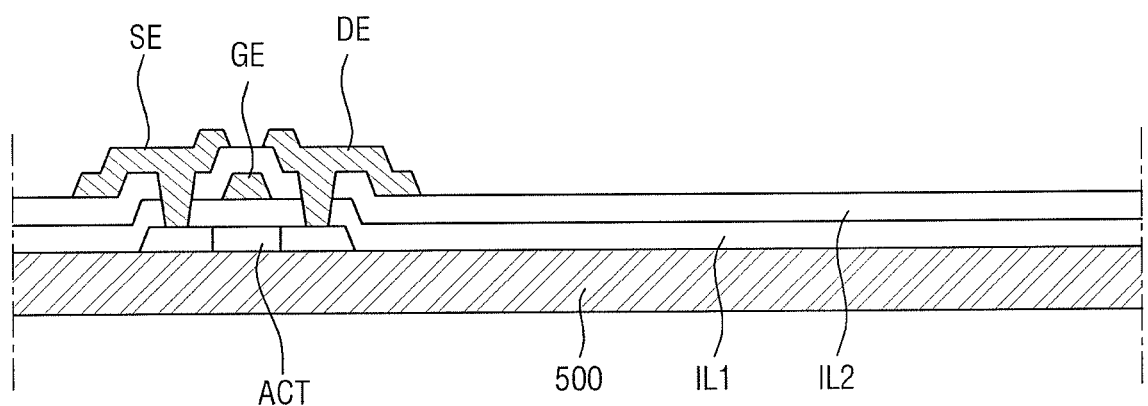
FIGS. 8-14 illustrate a cross-sectional views of stages in a method for manufacturing a display device according to an embodiment

Referring first to FIG. 8, preparing the substrate 500 on which the source electrode SE and the drain electrode DE are disposed and spaced apart from each other may be performed. The source electrode SE, the drain electrode DE, and the substrate 500 may be substantially the same as those of the display device according to embodiments.

Figure 9:
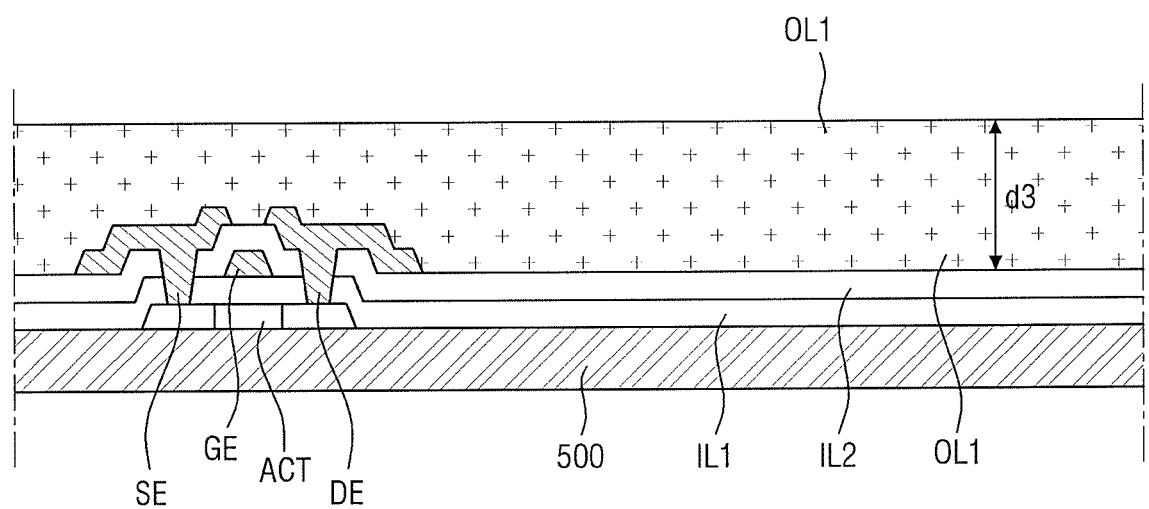

Referring next to FIG. 9, forming the first planarization layer OL1 on the source electrode SE and the drain electrode DE may be performed. The first planarization layer OL1 may be formed through one or more of chemical vapor deposition, slit coating, and spraying, as examples. The first planarization layer OL1 may have a thickness d3. The thickness d3 of the first planarization layer OL1 may be, for example, approximately 1.6 μm.

Figure 10:
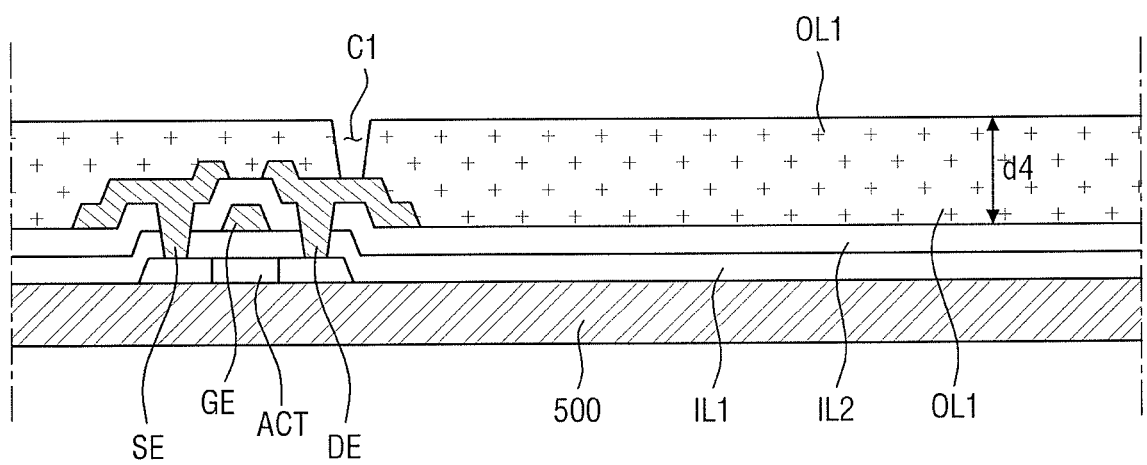

Referring next to FIG. 10, forming the first sub contact C1 in the first planarization layer OL1 and baking step be performed.

The forming the first sub contact C1 in the first planarization layer OL1 may be performed by exposing, developing, and patterning the first planarization layer OL1 using a photoresist pattern, and etching the patterned resultant structure by using a mask.

Subsequently, t baking the etched resultant structure may be performed. When baking is performed, a curing loss phenomenon may occur in the first planarization layer OL1, such that the thickness of the first planarization layer OL1 may be reduced.

In an embodiment, the first planarization layer OL1 may have a thickness d4 after the baking step. The thickness d4 of the baked first planarization layer OL1 may be less than the thickness d3 of the OL1 before baking, may be approximately 0.8 μm.

Although FIG. 10 illustrates that the first planarization layer OL1 covers the source electrode SE and/or the drain electrode DE in a region excluding the first sub contact C1, in some implementations, the source electrode SE and/or the drain electrode DE may be at least partially exposed by curing loss. For example, as described above, the step difference between the first planarization layer OL1 and the source electrode SE and/or the drain electrode DE (refer to d1 in FIG. 2) may be 100 Å or less, and in an embodiment, the step difference may be zero.

Figure 11:
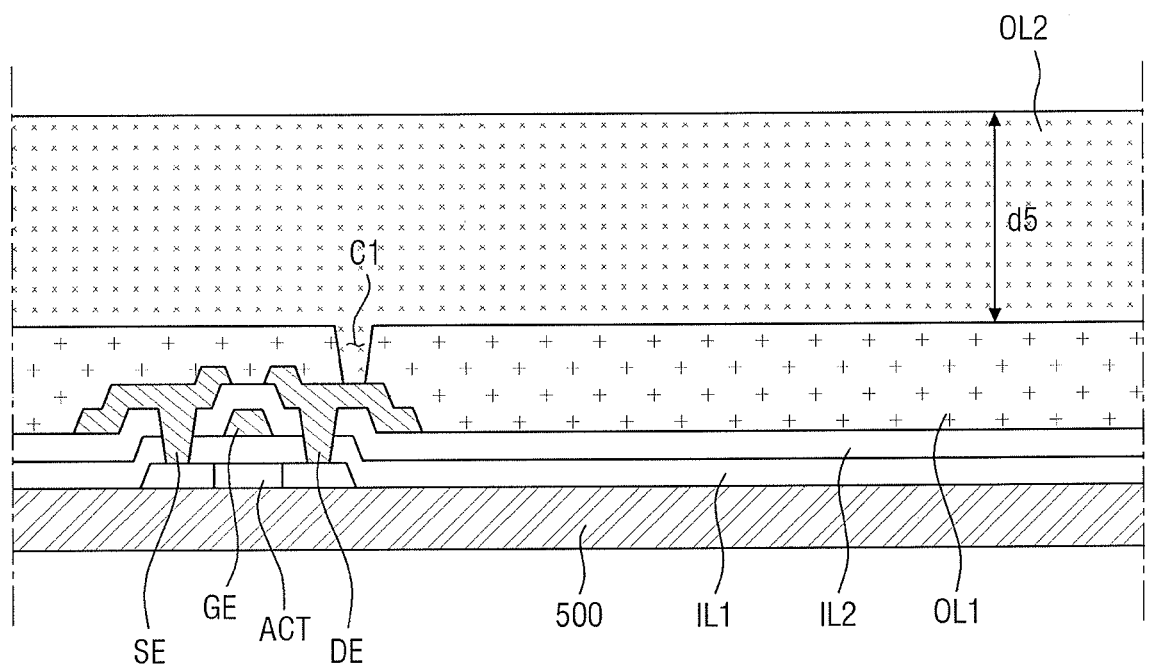

Referring next to FIG. 11, forming the second planarization layer OL2 on the first planarization layer OL1 may be performed.

The second planarization layer OL2 may be formed through one or more of chemical vapor deposition, slit coating, and spraying, as examples. The second planarization layer OL2 may have a thickness d5. The thickness d5 may be, for example, approximately 1.6 μm.

Figure 12:
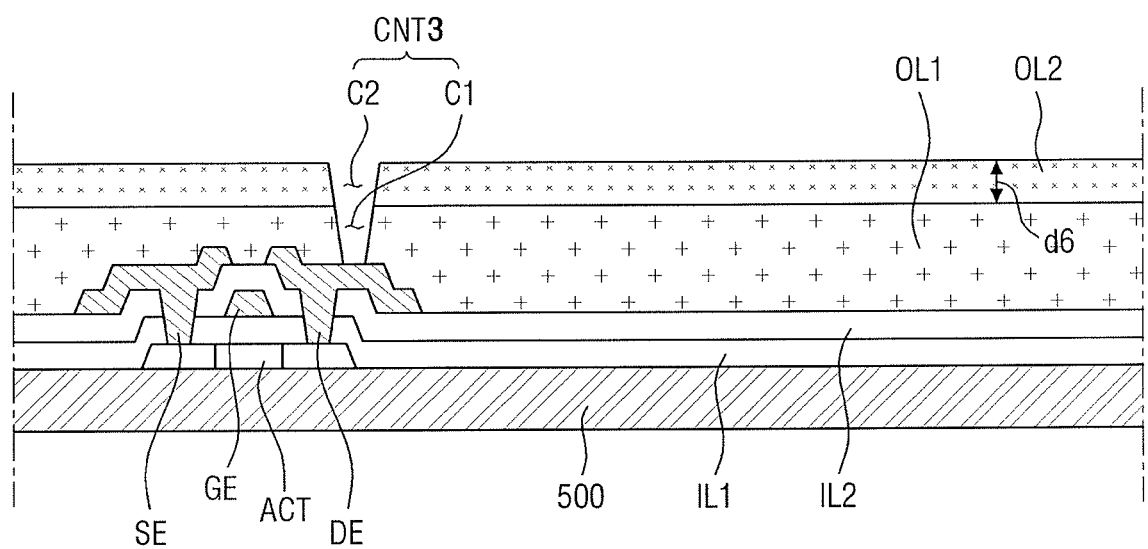

Referring next to FIG. 12, forming the second sub contact C2 in the second planarization layer OL2_2 and a baking may be performed.

Forming the second sub contact C2 in the second planarization layer OL2_2 may be performed by exposing, developing, and patterning the second planarization layer OL2_2 by using a photoresist pattern, and etching the patterned resultant structure using a mask.

The second sub contact C2 may overlap the first sub contact C1. The upper surface of the drain electrode DE may be at least partially exposed, as described with reference to FIG. 2.

Subsequently, baking the etched resultant structure may be performed. When baking is performed, a curing loss phenomenon may occur in the second planarization layer OL2. For example, the thickness of the second planarization layer OL2 may be reduced.

In an embodiment, the second planarization layer OL2 may have a thickness d6 after the baking step. The thickness d6 may be less than the thickness d5 as shown in FIG. 11. For example, the thickness d6 may be approximately 0.8 μm.

Figure 13:
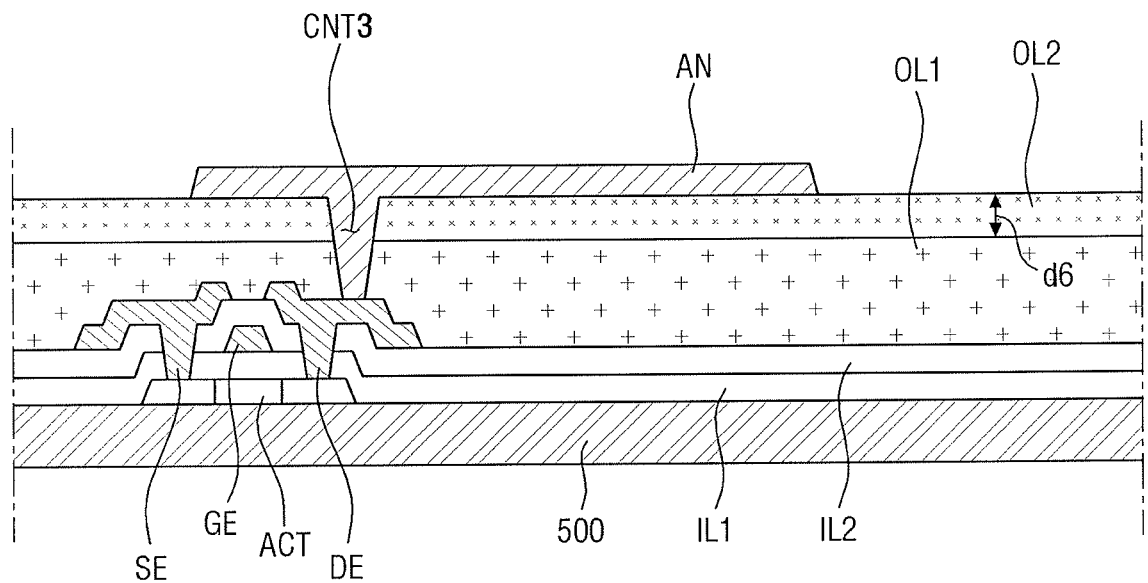
Figure 14:
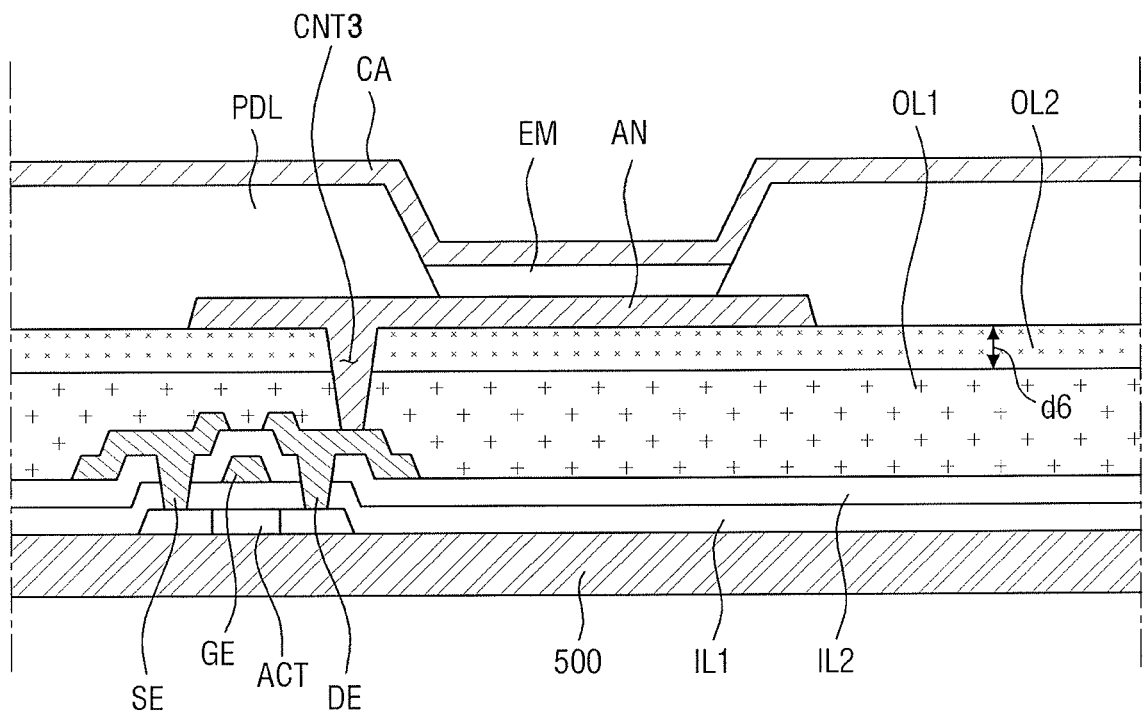

Referring next to FIG. 13, forming the first electrode AN on the second planarization layer OL2 may be performed. The step difference between the first planarization layer OL1 and the second planarization layer OL2 and components disposed beneath the first planarization layer OL1 and the second planarization layer OL2 may be reduced, thereby reducing the step difference in the first electrode AN. The step difference in the upper surface of the first electrode AN may be 70 nm or less, as described with reference to FIG. 2 and FIG. 3.

Referring next to FIG. 13, forming the pixel defining layer PDL on the first electrode AN may be performed. The pixel defining layer PDL may expose at least a part of the upper surface of the first electrode AN.

Subsequently, the organic emission layer EM may be formed on the upper surface of the first electrode AN exposed by the pixel defining layer. As described above with reference to FIG. 2, the organic emission layer EM may include a plurality of functional layers.

Subsequently, forming the second electrode CA on the organic emission layer EM and the pixel defining layer PDL may be performed. The second electrode CA may be formed as a front electrode on the entire surface of the substrate 500.

By way of summation and review, embodiments provide a display device in which a color separation phenomenon may be reduced or prevented. Embodiments provide a display device in which a polarizer may be omitted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof t as set forth in the following claims.

What is claimed is:

1. A display device, comprising:
   a substrate;
   a source electrode and a drain electrode on the substrate, the source electrode and the drain electrode being spaced apart from each other;
   a first planarization layer on the source electrode and the drain electrode, and including a first organic material;
   a second planarization layer directly on the first planarization layer, and including a second organic material; and
   a first electrode on the second planarization layer,
   wherein:
      a step difference between a top of the first planarization layer and a top of the drain electrode is 100 Å or less,
      the first planarization layer is between the second planarization layer and the source electrode and the drain electrode, and
      the second planarization layer is between the first planarization layer and the first electrode.

2. The display device as claimed in claim 1, wherein a step difference between highest and lowest portions in an upper surface of the first electrode is 70 nm or less.

3. The display device as claimed in claim 1, wherein the first planarization layer includes one or more selected from a polyimide, a polyacryl, and a polysiloxane.

4. The display device as claimed in claim 1, wherein the first planarization layer has a thickness of 0.8 μm.

5. The display device as claimed in claim 1, wherein the first planarization layer includes black pigment.

6. The display device as claimed in claim 5, wherein the black pigment includes black carbon.

7. The display device as claimed in claim 1, wherein the second planarization layer includes black pigment.

8. A display device, comprising:
   a substrate;
   a source electrode and a drain electrode on the substrate, the source electrode and the drain electrode being spaced apart from each other;
   a first planarization layer on the source electrode and the drain electrode, and including a first organic material;
   a second planarization layer directly on the first planarization layer, and including a second organic material;
   a first electrode on the second planarization layer; and
   a black matrix on the first electrode,
   wherein:
      the first planarization layer is between the second planarization layer and the source electrode and the drain electrode, and
      the second planarization layer is between the first planarization layer and the first electrode.

9. The display device as claimed in claim 8, further comprising an encapsulation layer on the first electrode, wherein the black matrix is on the encapsulation layer.

10. The display device as claimed in claim 9, further comprising a color filter on the encapsulation layer.

11. The display device as claimed in claim 8, further comprising a second electrode facing the first electrode, and a cover layer on the second electrode.

12. The display device as claimed in claim 11, wherein the cover layer includes manganese.

13. The display device as claimed in claim 8, wherein a step difference between a top of the first planarization layer and a top of the drain electrode is 100 Å or less.

14. The display device as claimed in claim 8, wherein the first planarization layer includes a black pigment.

15. The display device as claimed in claim 14, wherein the black pigment includes black carbon.

16. The display device as claimed in claim 8, wherein the second planarization layer includes a black pigment.

17. A method for manufacturing a display device, the method comprising:
   preparing a substrate on which a source electrode and a drain electrode are disposed and spaced apart from each other;
   forming a first planarization layer that includes a first organic material on the source electrode and the drain electrode such that a step difference between a top of the first planarization layer and a top of the drain electrode is 100 Å or less;
   forming a second planarization layer that includes a second organic material directly on the first planarization layer; and
   forming a first electrode on the second planarization layer,
   wherein:
      the first planarization layer is disposed between the second planarization layer and the source electrode and the drain electrode, and
      the second planarization layer is disposed between the first planarization layer and the first electrode.

18. The method as claimed in claim 17, wherein a step difference in a highest portion and a lowest portion of an upper surface of the first electrode is 70 nm or less.

19. The method as claimed in claim 17, wherein the first planarization layer includes a black pigment.

* * * * *